(12) United States Patent
Jeong et al.

(10) Patent No.: US 12,526,977 B2
(45) Date of Patent: Jan. 13, 2026

(54) SEMICONDUCTOR DEVICE

(71) Applicant: Samsung Electronics Co., Ltd., Suwon-si (KR)

(72) Inventors: Moonyoung Jeong, Suwon-si (KR); Kiseok Lee, Suwon-si (KR); Hyungeun Choi, Suwon-si (KR); Hyungjun Noh, Suwon-si (KR); Sangho Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 510 days.

(21) Appl. No.: 17/951,379

(22) Filed: Sep. 23, 2022

(65) Prior Publication Data
US 2023/0320066 A1 Oct. 5, 2023

(30) Foreign Application Priority Data
Mar. 29, 2022 (KR) ........................ 10-2022-0039089

(51) Int. Cl.
*H01L 27/108* (2006.01)
*H10B 12/00* (2023.01)

(52) U.S. Cl.
CPC .................................. *H10B 12/30* (2023.02)

(58) Field of Classification Search
CPC ........ H10B 12/30; H10B 12/03; H10B 12/05; H10D 30/6734; H10D 30/675;
(Continued)

(56) References Cited

U.S. PATENT DOCUMENTS 10,784,272 B2 9/2020 Lee et al.
10,861,854 B2 12/2020 Kim et al.
(Continued)

FOREIGN PATENT DOCUMENTS

KR 10-2017-0086753 A 7/2017
KR 10-2020-0087911 A 7/2020
(Continued)

OTHER PUBLICATIONS

Taiwan Office Action, dated Jun. 30, 2023, issued in corresponding Taiwan Patent Application No. 111147993.
(Continued)

*Primary Examiner* — Mohammed R Alam
(74) *Attorney, Agent, or Firm* — HARNESS, DICKEY & PIERCE, P.L.C.

(57) ABSTRACT

A semiconductor device may include a substrate including a memory cell region between a first connection region and a second connection region, gate electrodes extending in a first direction and including first pad regions having a step structure on the first connection region, back gate electrodes between the gate electrodes and extending in a direction opposite the first direction, vertical conductive patterns extending in a vertical direction and spaced apart from each other in the first direction on the memory cell region of the substrate, and active layers between the gate electrodes and the back gate electrodes on the memory cell region of the substrate. The active layers may extend in a second direction, intersecting the first direction, and may be electrically connected to the vertical conductive patterns. The back gate electrodes may include second pad regions having a step structure on the second connection region.

20 Claims, 20 Drawing Sheets

(58) Field of Classification Search
CPC .. H10D 30/6755; H10D 86/423; H10D 86/60; H10D 64/311
See application file for complete search history.

(56) References Cited

U.S. PATENT DOCUMENTS

| | | |
|---|---|---|
| 11,094,699 B1 | 8/2021 | Brewer et al. |
| 11,195,836 B2 | 12/2021 | Kim et al. |
| 2020/0212041 A1 | 7/2020 | Machkaoutsan et al. |
| 2020/0279601 A1 | 9/2020 | Kim et al. |
| 2021/0012828 A1 | 1/2021 | Kim et al. |
| 2021/0125991 A1 | 4/2021 | Kim et al. |
| 2021/0183861 A1 | 6/2021 | Lee et al. |
| 2021/0202488 A1 | 7/2021 | Choi |
| 2021/0249415 A1 | 8/2021 | Kang et al. |
| 2022/0068933 A1 | 3/2022 | Smythe, III et al. |
| 2022/0173106 A1 | 6/2022 | Choi et al. |
| 2022/0278106 A1 * | 9/2022 | Kim ............... H10B 12/30 |

FOREIGN PATENT DOCUMENTS

| | | |
|---|---|---|
| KR | 10-2021-0077098 A | 6/2021 |
| TW | 202230634 A | 8/2022 |

OTHER PUBLICATIONS

Korean Office Action dated Nov. 10, 2025 for corresponding Korean Patent Application No. 10-2022-0039089 and its English-language translation.

\* cited by examiner

SEMICONDUCTOR DEVICE

CROSS-REFERENCE TO RELATED APPLICATION(S)

This application claims benefit of priority to Korean Patent Application No. 10-2022-0039089, filed on Mar. 29, 2022 in the Korean Intellectual Property Office, the disclosure of which is incorporated herein by reference in its entirety.

BACKGROUND

Inventive concepts relate to a semiconductor device.

According to the development of the electronics industry and the needs of users, electronic devices have been reduced in size and have been implemented with higher degree of performance. Accordingly, semiconductor devices used in electronic devices may be required to be highly integrated and to have high performance. In order to manufacture a highly scaled semiconductor device, various studies have been conducted.

SUMMARY

An aspect of inventive concepts is to provide a semiconductor device having improved electrical characteristics and integration.

According to an embodiment of inventive concepts, a semiconductor device may include a substrate including a first connection region, a second connection region, and a memory cell region between the first connection region and the second connection region; gate electrodes stacked on the substrate, the gate electrodes spaced apart from each other and extending in a first direction, the first direction parallel to an upper surface of the substrate, the gate electrodes including first pad regions having a first step structure on the first connection region; back gate electrodes between the gate electrodes, the back gate electrodes extending in a direction opposite the first direction, the back gate electrodes including second pad regions having a second step structure on the second connection region; vertical conductive patterns extending in a vertical direction, the vertical direction perpendicular to the upper surface of the substrate, and the vertical patterns being spaced apart from each other in the first direction on the memory cell region of the substrate; active layers between the gate electrodes and the back gate electrodes on the memory cell region of the substrate, the active layers extending in a second direction, the second direction intersecting the first direction and parallel to the upper surface of the substrate, and the active layers being electrically connected to the vertical conductive patterns; and a data storage structure electrically connected to the active layers.

According to an embodiment of inventive concepts, a semiconductor device may include a substrate; a plurality of structures and a plurality of first interlayer insulating layers alternately stacked on the substrate; a vertical conductive pattern on the substrate, the vertical conductive pattern extending in a first direction, the first direction perpendicular to an upper surface of the substrate; and a data storage structure on the substrate, the data storage structure contacting the plurality of structures and the plurality of first interlayer insulating layers. Each of the plurality of structures may include a first gate electrode, a back gate electrode on the first gate electrode, a second gate electrode on the back gate electrode, a first active layer between the first gate electrode and the back gate electrode, and a second active layer between the second gate electrode and the back gate electrode. The first active layer and the second active layer may extend in a second direction. The second direction may be parallel to the upper surface of the substrate. The first active layer and the second active layer may be electrically connected to the vertical conductive pattern. The first active layer and the second active layer respectively may include a region overlapping the back gate electrode in the first direction.

According to an embodiment of inventive concepts, a semiconductor device may include a substrate including a first connection region, a second connection region, and a memory cell region between the first connection region and the second connection region; a first active layer and a second active layer on the memory cell region of the substrate, the first active layer and the second active layer extending in a first direction, the first direction parallel to an upper surface of the substrate; a gate structure intersecting the first active layer and the second active layer, the gate structure extending in a second direction, the second direction parallel to the upper surface of the substrate; and a vertical conductive pattern connected to the first active layer and the second active layer. The vertical conductive pattern may extend in a third direction. The third direction may be perpendicular to the upper surface of the substrate. The gate structure may include a back gate electrode between the first active layer and the second active layer; a first gate electrode below the first active layer; and a second gate electrode on the second active layer. The back gate electrode and the second gate electrode each may extend less than the first gate electrode on the first connection region, and the second gate electrode may extend less than the back gate electrode on the second connection region.

BRIEF DESCRIPTION OF DRAWINGS

The above and other aspects, features, and advantages of inventive concepts will be more clearly understood from the following detailed description, taken in conjunction with the accompanying drawings, in which.

DETAILED DESCRIPTION

Hereinafter, example embodiments of inventive concepts will be described with reference to the accompanying drawings.

Figure 1:
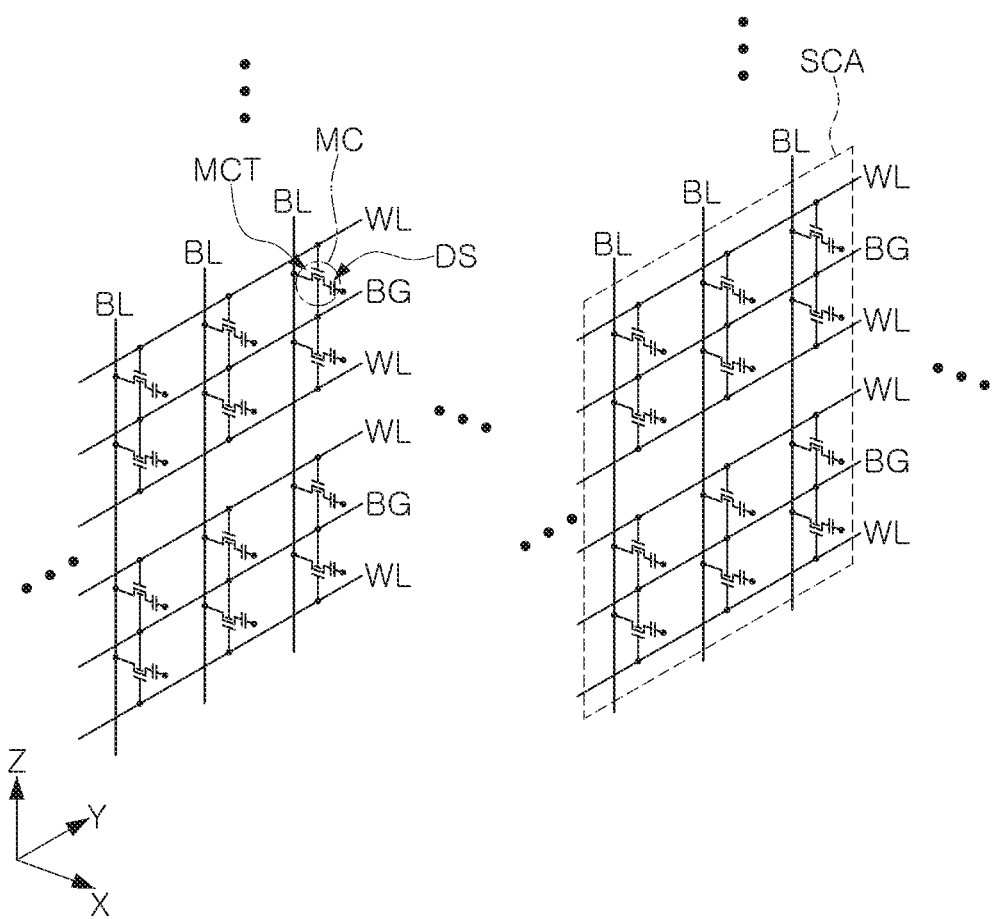
FIG. 1 is a simplified circuit diagram illustrating a memory cell array of a semiconductor device according to example embodiments.

FIG. 1 is a simplified circuit diagram illustrating a memory cell array of a semiconductor device according to example embodiments.

Referring to FIG. 1, a memory cell array of a semiconductor device according to example embodiments may include a plurality of sub-cell arrays SCA. The plurality of sub-cell arrays SCA may be arranged in an X-direction. Each of the plurality of sub-cell arrays SCA may include a plurality of bit lines BL, a plurality of word lines WL, a plurality of back gate lines BG, and a plurality of memory cells MC. The memory cell MC may include a memory cell transistor MCT and a data storage element DS. One memory cell MC may be disposed between one word line WL and one bit line BL. The cell array of the semiconductor device may correspond to a memory cell array of a dynamic random access memory (DRAM) device.

The word lines WL may extend in a Y-direction. The word lines WL in one sub-cell array SCA may be spaced apart from each other in a Z-direction. The bit lines BL may extend in the Z-direction. The bit lines BL in one sub-cell array SCA may be spaced apart from each other in the Y-direction. The word lines WL and the bit lines BL may be conductive patterns (e.g., metal lines) disposed on a substrate (101 of FIGS. 3A and 3B) and extending in one direction.

The memory cell transistor MCT may include a gate, a source, and a drain. The gate may be connected to the word line WL, the source may be connected to the bit line BL, and the drain may be connected to the data storage element DS. The data storage element DS may include a capacitor including lower and upper electrodes and a dielectric layer.

One back gate line BG may be disposed between two adjacent word lines WL. For example, two adjacent word lines WL may share one back gate line BG. A voltage different from the voltage applied to the word lines WL may be applied to the back gate line BG. Channel regions (130c of FIG. 3A), which are channels of the memory cell transistor MCT, may be floating bodies, and since the back gate line BG may have charges, e.g., holes, accumulated in the channel regions (130c of FIG. 3A), a floating body effect may be limited and/or suppressed or controlled and a threshold voltage of the memory cell transistors MCT may be limited and/or prevented from being changed. Accordingly, the back gate line BG may improve electrical characteristics of the memory cell transistors MCT.

In an example embodiment, the back gate lines BG may be independently and individually controlled in consideration of interlayer characteristic distribution of the memory cell transistors MCT disposed in each layer. In an example embodiment, at least some of the back gate lines BG may be electrically connected to each other and controlled together.

According to an embodiment of inventive concepts, the circuit diagram of FIG. 1 may be implemented as, for example, a semiconductor device described with reference to FIGS. 2 to 4 below.

Figure 2:
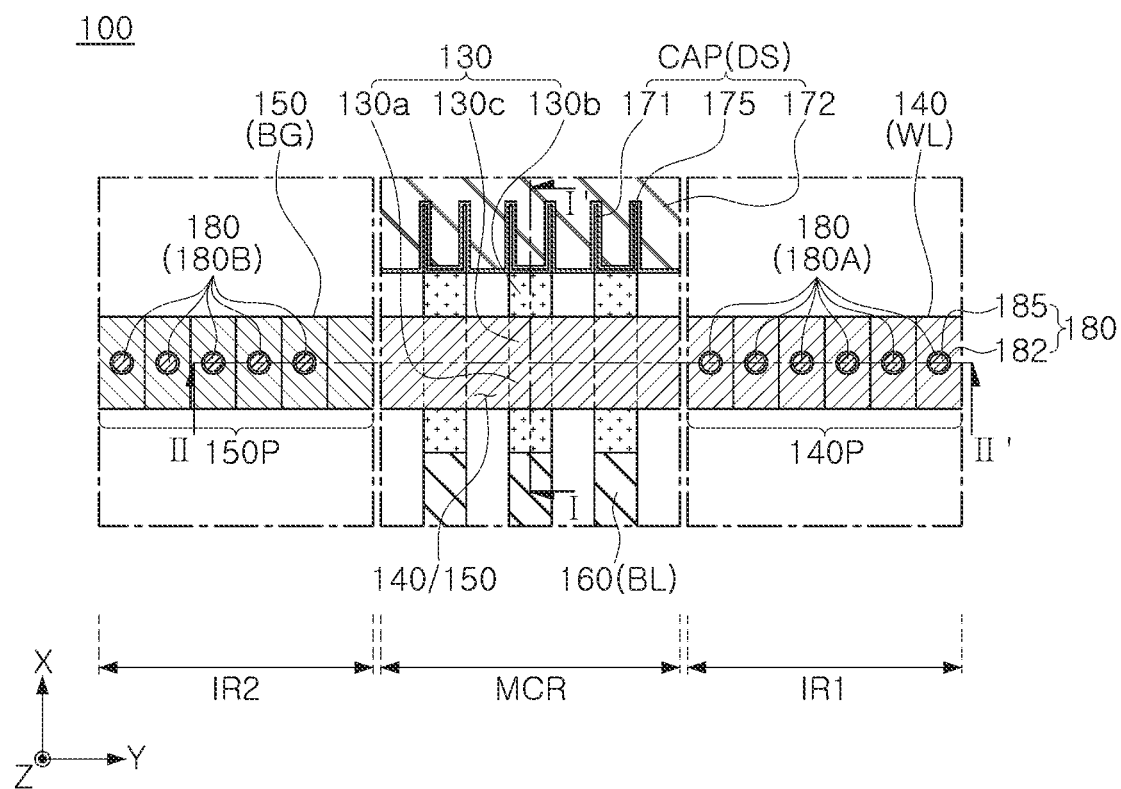
FIG. 2 is a schematic plan view of a semiconductor device according to example embodiments.

FIG. 2 is a schematic plan view of a semiconductor device according to example embodiments. FIG. 2 illustrates the structure of the sub-cell array described with reference to FIG. 1.

Figure 3A:
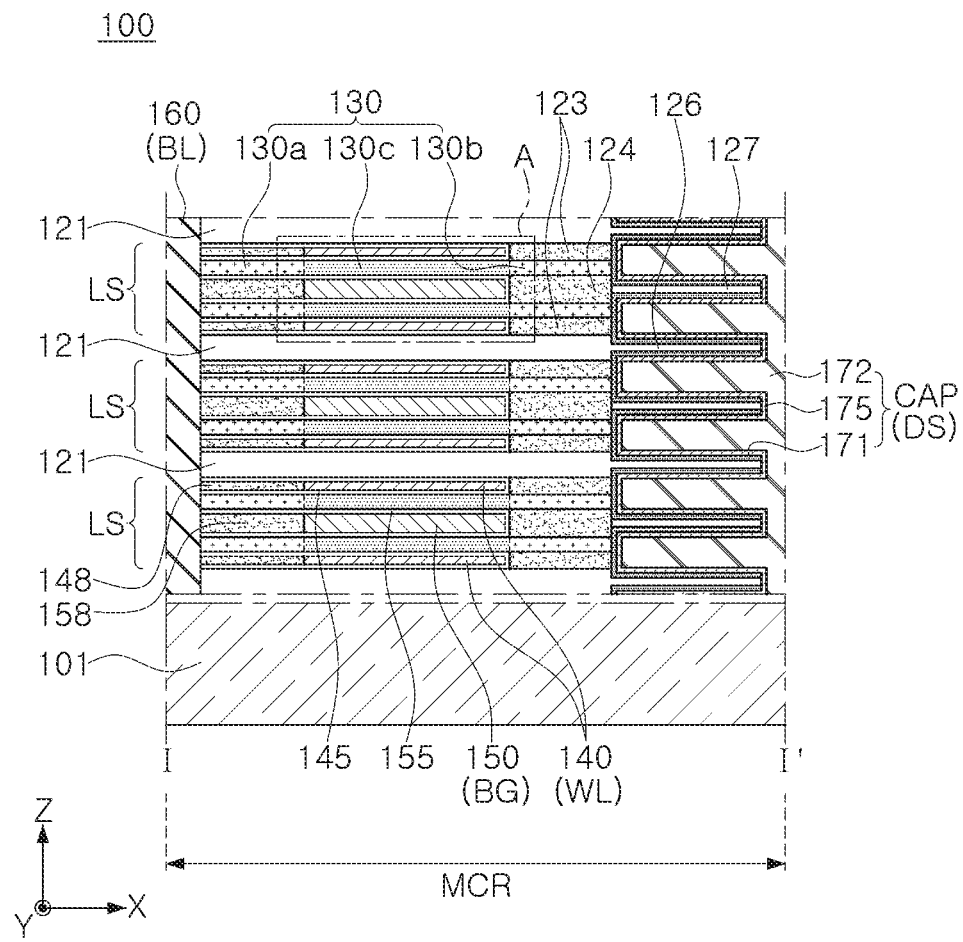
FIGS. 3A and 3B are schematic cross-sectional views of semiconductor devices according to example embodiments.
Figure 3B:
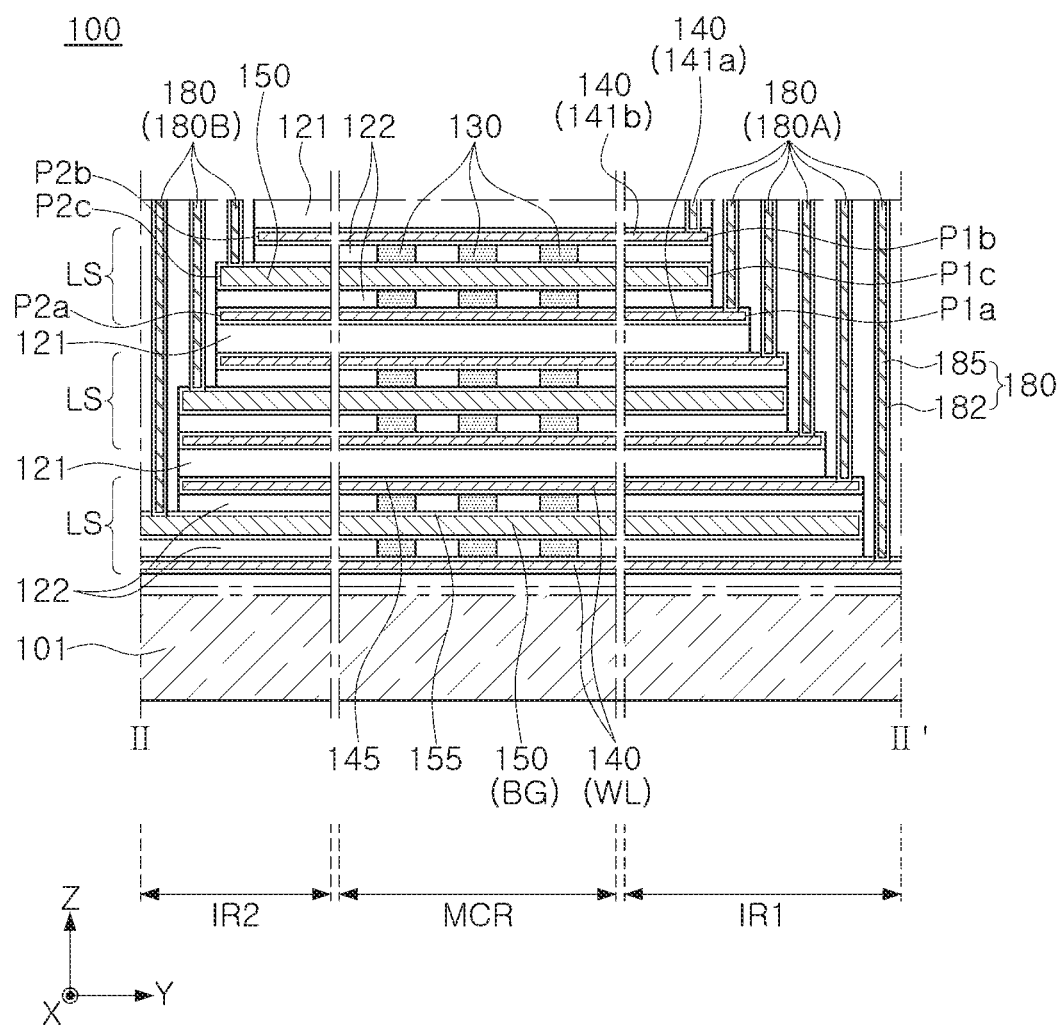

FIGS. 3A and 3B are schematic cross-sectional views of semiconductor devices according to example embodiments. FIG. 3A is a cross-sectional view of the semiconductor device of FIG. 2 taken along line I-I', and FIG. 3B is a cross-sectional view of the semiconductor device of FIG. 2 taken along cutting line II-II'.

Figure 4:
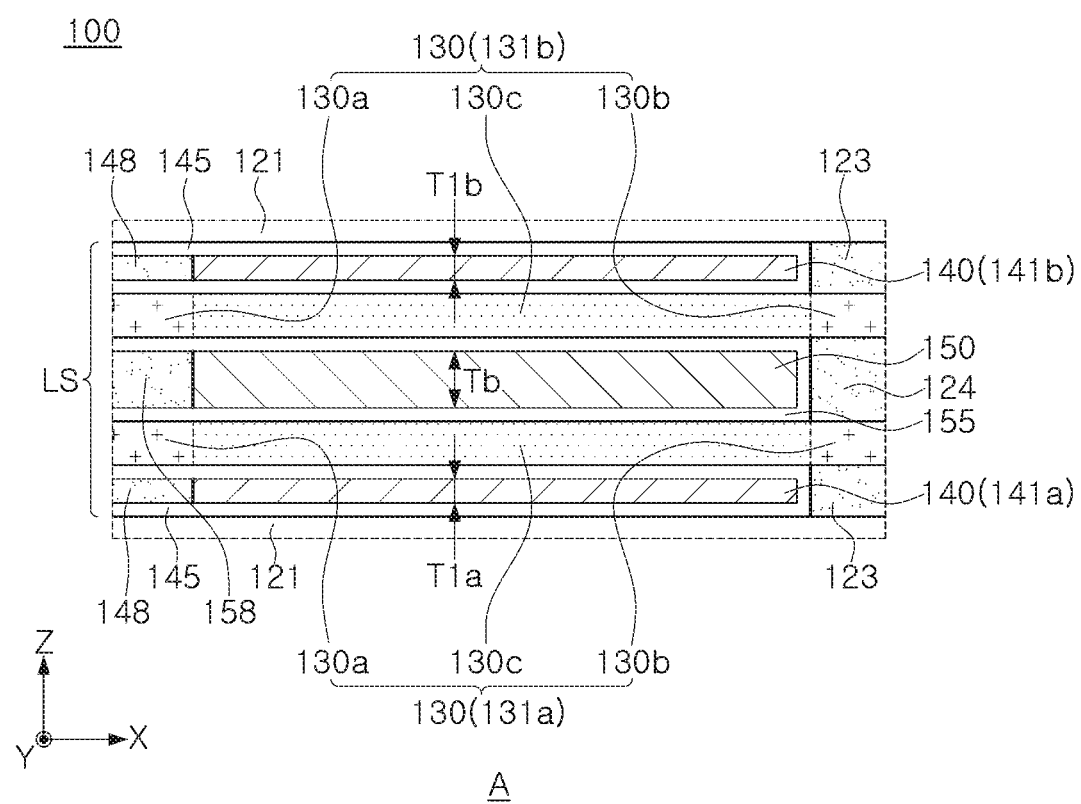
FIG. 4 is a partially enlarged view of a semiconductor device according to example embodiments.

FIG. 4 is a partially enlarged view of a semiconductor device according to example embodiments. FIG. 4 is an enlarged view of region 'A' of FIG. 3A.

Referring to FIGS. 2 to 4, the semiconductor device 100 includes a substrate 101, structures LS and first interlayer insulating layers 121 alternately stacked on the substrate 101, vertical conductive patterns 160 extending in the Z-direction, a capacitor structure CAP, and contact plugs 180.

Each of the structures LS may include active layers 130 extending in the X-direction, gate structures 140 and 150 intersecting the active layers 130 and extending in the Y-direction, gate dielectrics 145 and 155, first capping layers 123 and 124, second capping layers 148 and 158, separation insulating layers 126 and 127, and second interlayer insulating layers 122. The gate structures 140 and 150 may include a gate electrode 140 and a back gate electrode 150.

The capacitor structure CAP may include a first electrode 171, a second electrode 172, and a capacitor dielectric 175 between the first and second electrodes 171 and 172. The capacitor structure CAP may provide a plurality of data storage elements DS. The X-direction and the Y-direction may each be directions parallel to an upper surface of the substrate 101, and the Z-direction may be a direction perpendicular to the upper surface of the substrate 101.

The semiconductor device 100 may include, for example, a cell array of DRAM. The vertical conductive pattern 160 may correspond to the bit line BL of FIG. 1, the gate electrode 140 may correspond to the word line WL of FIG. 1, and the back gate electrode 150 may correspond to the back gate line BG of FIG. 1, and the capacitor structure CAP may correspond to the data storage element DS of FIG. 1.

The substrate 101 may include a semiconductor material, for example, a group IV semiconductor, a group III-V compound semiconductor, or a group II-VI compound semiconductor. For example, the group IV semiconductor may include silicon, germanium, or silicon-germanium. The substrate 101 may further include impurities. The substrate 101 may include a silicon substrate, a silicon on insulator (SOI) substrate, a germanium substrate, a germanium on insulator (GOI) substrate, a silicon-germanium substrate, or an epitaxial layer.

The substrate 101 may include a memory cell region MCA, a first connection region IR1, and a second connection region IR2. The memory cell region MCA may be disposed between the first connection region IR1 and the second connection region IR2. Pad regions 140P of the gate electrodes 140 may be provided on the first connection region IR1, and pad regions 150P of the back gate electrodes 150 may be provided on the second connection region IR2.

The plurality of first interlayer insulating layers 121 and the plurality of structures LS may be stacked on the substrate 101 to form a stack structure. The structures LS and the first interlayer insulating layers 121 may be alternately stacked. The plurality of structures LS may be spaced apart from each other in the Z-direction by the plurality of first interlayer insulating layers 121. The first interlayer insulating layer 121 may include an insulating material, for example, at least one of silicon oxide, silicon nitride, silicon oxynitride, and silicon oxycarbide.

The active layers 130 may be disposed on the substrate 101 and may extend horizontally in the X-direction. A plurality of active layers 130 may be stacked to be spaced apart from each other in the Z-direction and may be arranged in plural in the Y-direction. Second interlayer insulating layers 122 may be disposed between the active layers 130 arranged in the Y-direction. The active layers 130 may have a line shape, a bar shape, or a column shape intersecting the gate structures 140 and 150 and extending in the X-direction. In an example embodiment, the active layers 130 may include a semiconductor material, for example, silicon, germanium, or silicon-germanium.

Each of the active layers 130 may include a first region 130a, a second region 130b, and a channel region 130c. The channel region 130c may be disposed between the first region 130a and the second region 130b. The first region 130a may be in contact with the vertical conductive pattern 160 to be electrically connected to the vertical conductive pattern 160. The second region 130b may be in contact with the first electrode 171 of the capacitor structure CAP and may be electrically connected to the first electrode 171. A length of the first region 130a in the X-direction and a length of the second region 130b in the X-direction may be different or the same as each other. The channel region 130c may overlap the gate structures 140 and 150 in the Z-direction. When the active layer 130 is formed of a semiconductor material, the first region 130a and the second region 130b may respectively include impurities, and the impurities may have N-type or P-type conductivity.

At least a portion of the first region 130a may correspond to a first source/drain region of the memory cell transistor MCT of FIG. 1, and at least a portion of the second region 130b may correspond to a second source/drain region of the memory cell transistor MCT of FIG. 1. At least a portion of the channel region 130c may correspond to a channel of the memory cell transistor MCT of FIG. 1. The first region 130a may provide a region for directly connecting the memory cell transistor MCT to the bit line BL, and the second region 130b may provide a region for directly connecting the memory cell transistor MCT to the data storage element DS.

In another example, the active layers 130 may include an oxide semiconductor, for example, at least one of hafnium-silicon oxide (HSO), hafnium-zinc oxide (HZO), indium-zinc oxide (IZO), indium-gallium oxide (IGO), indium-tin oxide (ITO), indium-gallium-zinc oxide (IGZO), and indium-tin-zinc oxide (ITZO).

In another example, the active layers 130 may include a two-dimensional (2D0 material in which atoms may form a desired crystal structure and form a channel of a transistor. The 2D material layer may include at least one of a transition metal dichalcogenide (TMD) material layer, a black phosphorous material layer, and a hexagonal boron-nitride (hBN) material layer. For example, the 2D material layer may include at least one of BiOSe, $CrI_3$, $WSe_2$, $MoS_2$, TaS, WS, SnSe, ReS, β-SnTe, MnO, AsS, P(black), InSe, h-BN, GaSe, GaN, SrTiO, MXene, and Janus 2D materials.

In another example, the structure LS may further include epitaxial layers grown from the active layer 130 and respectively connected to the first region 130a and the second region 130b of the active layer 130.

The gate electrodes 140 may be disposed on the substrate 101 and may extend horizontally in the Y-direction. A plurality of gate electrodes 140 may be stacked and spaced apart from each other in the Z-direction and may be arranged in the X-direction. The gate electrodes 140 may be disposed between the channel region 130c of the active layer 130 and the first interlayer insulating layer 121. The gate electrodes 140 may have a line shape, a bar shape, or a column shape intersecting the vertical conductive pattern 160 and extending in the Y-direction.

The gate electrodes 140 may extend to have different lengths in the Y-direction to provide a contact region in which an upper surface of each of the plurality of gate electrodes 140 stacked in the Z-direction in one sub-cell array is exposed. For example, as shown in FIGS. 2 and 3B, the gate electrodes 140 may provide first pad regions 140P having a step structure on the first connection region IR1. The first pad regions 140P may provide a step structure to the gate electrodes 140, and an upper second gate electrode 140 may extend to be shorter than a lower first gate electrode 140 so that an upper surface of the lower first gate electrode 140 may be exposed.

The gate electrodes 140 may include a conductive material, and the conductive material may include at least one of a doped semiconductor material (e.g., doped silicon, doped germanium, etc.), conductive metal nitride (e.g., titanium nitride, tantalum nitride, tungsten nitride, etc.), a metal (e.g., tungsten, titanium, tantalum, cobalt, aluminum, ruthenium, etc.), and a metal-semiconductor compound (e.g., tungsten silicide, cobalt silicide, titanium silicide, etc.). The gate electrodes 140 may be the word lines WL described with reference to FIG. 1.

The back gate electrodes 150 may be disposed between the gate electrodes 140. For example, in one structure LS, one back gate electrode 150 may be disposed between at least two gate electrodes 140. A plurality of back gate electrodes 150 may be stacked and spaced apart from each other in the Z-direction and may be arranged in the X-direction. The back gate electrode 150 may be disposed between the channel regions 130c of two active layers 130 in one structure LS. The back gate electrodes 150 may also have a line shape, a bar shape, or a column shape extending in the Y-direction.

The back gate electrodes 150 may extend to have different lengths in the Y-direction to provide a contact region in which an upper surface of each of the back gate electrodes 150 stacked in the Z-direction in one sub-cell array is exposed. For example, as shown in FIGS. 2 and 3B, the back gate electrodes 150 may extend in a direction opposite to the Y-direction on the second connection region IR2 to provide second pad regions 150P having a step structure. The second pad regions 150P may provide a step structure to the back gate electrodes 150, and an upper second back gate electrode 150 may extend to be shorter than a lower first back gate electrode 150 so that an upper surface of the lower first back gate electrode 150 may be exposed.

The back gate electrodes 150 may include a conductive material, for example, the same material as that of the gate electrodes 140.

Referring to FIG. 4, the first back gate electrode 150 may be disposed between a first gate electrode 141a and a second gate electrode 141b spaced apart from each other in the Z-direction. A first active layer 131a may be disposed between the first gate electrode 141a and the first back gate electrode 150, and a second active layer 131b may be disposed between the second gate electrode 141b and the first back gate electrode 150. In an example embodiment, a vertical thickness Tb of the first back gate electrode 150 may be different from a vertical thickness T1a of the first gate electrode 141a and a vertical thickness T1b of the second gate electrode 141b and, for example, the vertical thickness Tb of the first back gate electrode 150 may be greater than the vertical thickness T1a of the first gate electrode 141a.

Referring to FIG. 3B, on the second connection region IR2, a second end surface P2a of the first gate electrode 141a and a second end surface P2c of the first back gate electrode 150 may be coplanar, and on the first connection region IR1, a first end surface P1b of the second gate electrode 141b and a first end surface P1c of the first back gate electrode 150 may be coplanar. The first back gate electrode 150 may extend to have a length longer than that of the second gate electrode 141b on the second connection region IR2 to provide the pad region 150P. The first back gate electrode 150 and the second gate electrode 141b may extend to be shorter than the first gate electrode 141a on the first connection region IR1.

A first contact plug 180A connected to the first gate electrode 141a may be adjacent to the first end surface P1c of the first back gate electrode 150, and a second contact plug 180B connected to the first back gate electrode 150 may be adjacent to the second end surface P2c of the first back gate electrode 150. The first end surface P1b of the second gate electrode 141b may face the first contact plug 180A connected to the first gate electrode 141a, and the second end surface P2b of the second gate electrode 141b may face the second contact plug 180B connected to the first back gate electrode 150.

According to an example embodiment, by disposing one back gate electrode 150 between two gate electrodes 140, one back gate line BG shared by the two word lines WL may be provided.

A voltage may be applied to the channel regions 130c of the active layers 130 adjacent to the back gate electrode 150 through the back gate electrode 150, so that a threshold voltage of the memory cell transistor MCT may be may be controlled and a floating body effect may be limited and/or suppressed. Accordingly, electrical characteristics and reliability of the semiconductor device may be improved.

Memory cell transistors MCT stacked in the Z-direction may have interlayer characteristic distribution. By monitoring such interlayer characteristic distribution, voltage conditions applied to the back gate electrodes 150 present in each structure LS may be set to be different to limit and/or minimize the interlayer characteristic distribution of the memory cell transistors MCT. According to an example embodiment, by monitoring the characteristic distribution of the memory cell transistors MCT for each block, bank, or chip of the semiconductor memory device, voltage conditions applied to the individual back gate electrodes 150 may also be set to be different.

Meanwhile, compared to a memory device having a double gate structure in which the gate electrodes 140 disposed above and below one active layer 130 provide one word line WL, in an example embodiment, a stack height of the memory cell structure required for implementing the same stack memory cells MC as that of the double gate structure may be relatively low. For example, a memory device having a double gate structure requires two active layers and four gate layers to provide two stacked memory cell transistors, but a structure of inventive concepts requires two active layers and three gate layers (two gate electrode layers positioned on top and bottom and one back gate electrode layer positioned in the middle). Here, the gate layer may be counted in the form of a layer stacked in a cross-section view of the memory cell structure. Thus, according to an example embodiment, even if the same process as that of the memory device having a double gate structure is used, more memory cells may be arranged in the memory cell structure having the same stack height, so that the integration of the semiconductor device may be improved.

The gate dielectrics 145 and 155 may include gate dielectric layers 145 covering upper and lower surfaces of each of the gate electrodes 140 and back gate dielectric layers 155 covering upper and lower surfaces of each of the back gate electrodes 150.

The gate dielectric layer 145 may be disposed between the gate electrode 140 and the active layer 130, between the gate electrode 140 and the first interlayer insulating layer 121, and between the gate electrode 140 and the first capping insulating layer 123. The gate dielectric layer 145 may extend to the vertical conductive pattern 160. The gate dielectric layer 145 may include at least one of silicon oxide, silicon nitride, a low-k material, and a high-k material. The high-k material may refer to a dielectric material having a higher dielectric constant than silicon oxide, and the low-k material may refer to a dielectric material having a lower dielectric constant than silicon oxide. The high-k material may be, for example, a metal oxide or a metal oxynitride. The high-k material may be, for example, any one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$). The gate dielectric layer 145 may be formed of a single layer or multiple layers of the materials described above.

The back gate dielectric layer 155 may be disposed between the back gate electrode 150 and the active layers 130 and between the back gate electrode 150 and the second capping insulating layer 124. The back gate dielectric layer 155 may extend to the vertical conductive pattern 160. The back gate dielectric layer 155 may include the same material as that of the gate dielectric layer 145.

The first capping layers 123 and 124 may include a first capping insulating layer 123 and a second capping insulating layer 124. The first capping insulating layer 123 may be disposed between the gate electrode 140 and the first electrode 171 of the capacitor structure CAP. The second capping insulating layer 124 may be disposed between the back gate electrode 150 and the first electrode 171 of the capacitor structure CAP. The first capping layers 123 and 124 may include a material different from that of the first interlayer insulating layers 121. The first capping layers 123 and 124 may include an insulating material, for example, at least one of silicon nitride, silicon oxynitride, and silicon oxycarbide. The first capping layers 123 and 124 may overlap the first region 130a of the active layer 130 in the Z-direction.

The second capping layers 148 and 158 may include a gate capping layer 148 and a back gate capping layer 158. The gate capping layer 148 may be disposed between the gate electrode 140 and the vertical conductive pattern 160. Upper and lower surfaces of the gate capping layer 148 may be covered by the gate dielectric layer 145. The back gate capping layer 158 may be disposed between the back gate electrode 150 and the vertical conductive pattern 160. Upper and lower surfaces of the back gate capping layer 158 may be covered by the back gate dielectric layer 155. The second capping layers 148 and 158 may include a material different from that of the first interlayer insulating layers 121. The second capping layers 148 and 158 may include an insulating material, for example, at least one of silicon nitride, silicon oxynitride, and silicon oxycarbide. The second capping layers 148 and 158 may overlap the second region 130b of the active layer 130 in the Z-direction.

The separation insulating layers 126 and 127 may be disposed between the first electrodes 171 and may include alternately stacked first separation insulating layers 126 and second separation insulating layers 127. The first separation insulating layer 126 may extend in the X-direction from the first interlayer insulating layer 121, and may have a thickness less than a thickness of the first interlayer insulating layer 121. The second separation insulating layer 127 may be connected to the second capping insulating layer 124, and may have a thickness less than a thickness of the second capping insulating layer 124. The separation insulating layers 126 and 127 may include an insulating material, for example, silicon oxide.

The second interlayer insulating layers 122 may be disposed to contact side surfaces of the active layers 130 between the gate electrodes 140 and the back gate electrodes 150. For example, the second interlayer insulating layers 122 may be disposed between the two gate electrodes 140 and the back gate electrode 150 therebetween. The second interlayer insulating layer 122 may have a thickness less than that of the first interlayer insulating layer 121, but is not limited thereto. The second interlayer insulating layers 122 may include an insulating material, for example, at least one of silicon oxide, silicon nitride, silicon oxynitride, and silicon oxycarbide.

The vertical conductive patterns 160 may extend vertically on the substrate 101 in the Z-direction. A plurality of vertical conductive patterns 160 may be arranged in the Y-direction. A plurality of active layers 130 stacked in the Z-direction may be electrically connected to one vertical conductive pattern 160. The vertical conductive patterns 160 may have a line shape, a bar shape, or a column shape extending in the Z-direction. The vertical conductive patterns 160 may include at least one of a doped semiconductor material, a conductive metal nitride, a metal, and a metal-semiconductor compound. The vertical conductive patterns 160 may correspond to the bit line BL described with reference to FIG. 1.

The capacitor structure CAP may be disposed to be adjacent to the second region 130b of the active layer 130. The capacitor structure CAP may include a first electrode 171, a capacitor dielectric 175 on the first electrode 171, and a second electrode 172 on the capacitor dielectric 175. As illustrated in FIGS. 2 and 3A, the first electrode 171 may have a cylinder shape, but is not limited thereto, and may have a column shape in embodiments.

The first electrodes 171 may be in a state in which nodes are separated on the separation insulating layers 126 and 127. The first electrodes 171 may be referred to as 'storage node electrodes'. The first electrodes 171 may include at least one of a doped semiconductor material, a conductive metal nitride, a metal, and a metal-semiconductor compound.

The capacitor dielectric 175 may conformally cover the first electrode 171. The capacitor dielectric 175 may include, for example, at least one of a high-k material such as zirconium oxide ($ZrO_2$), aluminum oxide ($Al_2O_3$), or hafnium oxide ($Hf_2O_3$).

The second electrode 172 may cover the capacitor dielectric 175 and may extend in the Y-direction. The second electrode 172 may be referred to as a 'plate electrode'. The second electrode 172 may include at least one of a doped semiconductor material, a conductive metal nitride, a metal, and a metal-semiconductor compound.

The contact plugs 180 may extend in the Z-direction to be electrically connected to the gate structures 140 and 150. The contact plugs 180 may have side surfaces inclined with respect to the upper surface of the substrate 101. The contact plugs 180 may include first contact plugs 180A disposed on the first connection region IR1 and second contact plugs 180B disposed on the second connection region IR2. The first contact plugs 180A may be connected to the first pad regions 140P, and the second contact plugs 180B may be connected to the second pad regions 150P. Each of the contact plugs 180 may include a barrier layer 182 and a plug layer 185, and the barrier layer 182 may cover side surfaces and a lower surface of the plug layer 185. The barrier layer 182 may include, for example, a conductive metal nitride, and the plug layer 185 may include a metal material.

FIGS. 5A to 5D are partially enlarged views of semiconductor devices according to example embodiments. FIGS. 5A to 5D illustrate regions corresponding to FIG. 4.

Figure 5A:
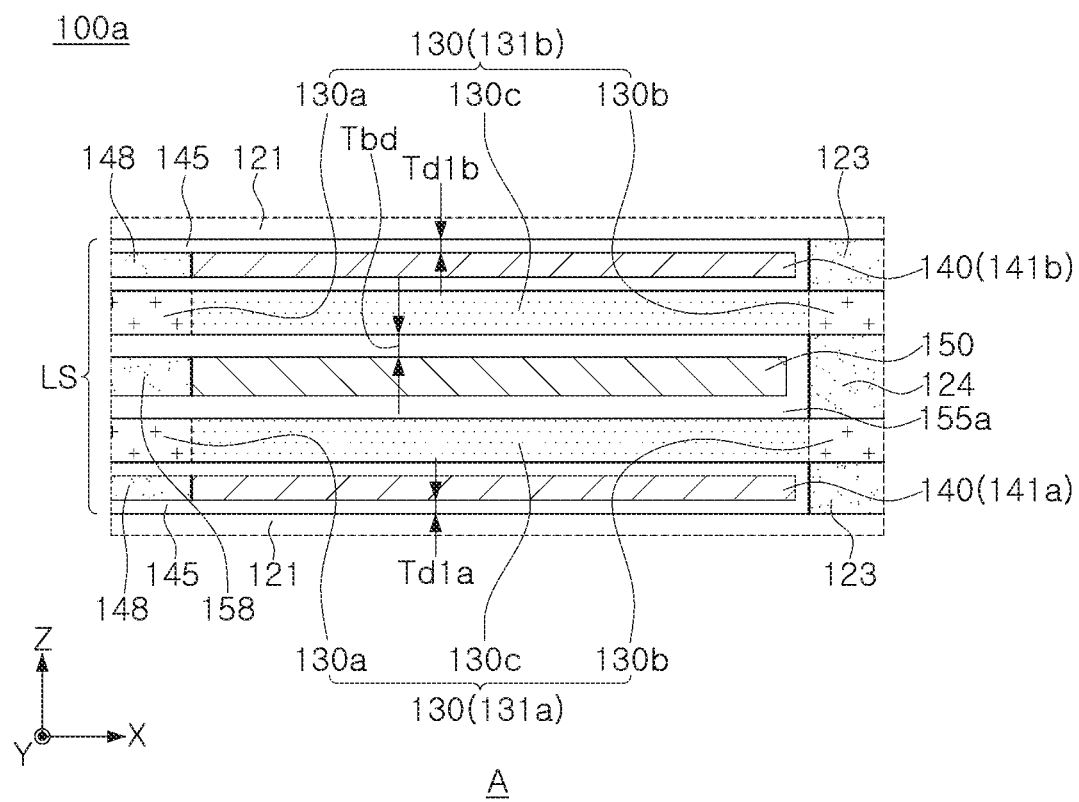
FIGS. 5A to 5D are partially enlarged views of semiconductor devices according to example embodiments.

Referring to FIG. 5A, in a semiconductor device 100a, a thickness Tbd of a back gate dielectric layer 155a may be different from a thickness Td1a of the first gate dielectric layer 145 and a thickness Td1b of the second gate dielectric layer 145. For example, the thickness Tbd of the back gate dielectric layer 155a may be greater than the thickness Td1a of the first gate dielectric layer 145.

Figure 5B:
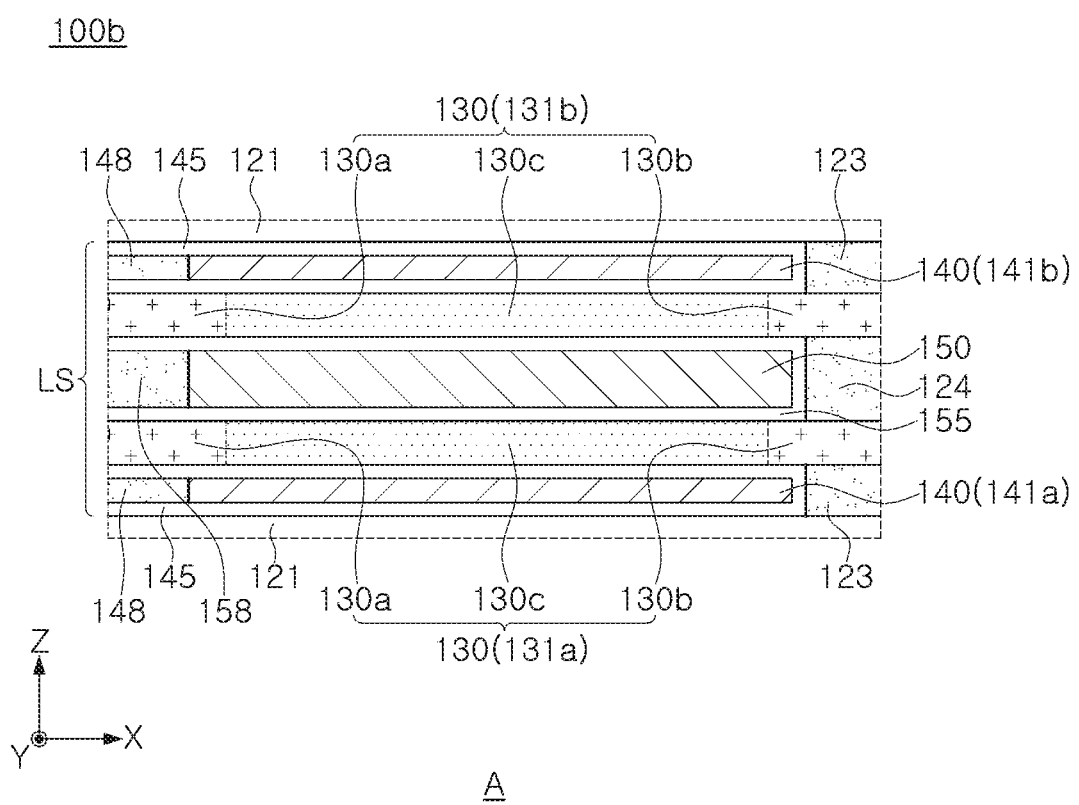

Referring to FIG. 5B, in a semiconductor device 100b, portions of the first and second regions 130a and 130b of the active layer 130 may overlap the gate electrodes 140 and the back gate electrode 150 in the Z-direction. For example, a portion of the first region 130a and a portion of the second region 130b of the first active layer 131a may overlap the first gate electrode 141a in the Z-direction, and a portion of the second active layer 131b and a portion of the second region 130b of the second active layer 131b may overlap the second gate electrode 141b in the Z-direction.

Figure 5C:
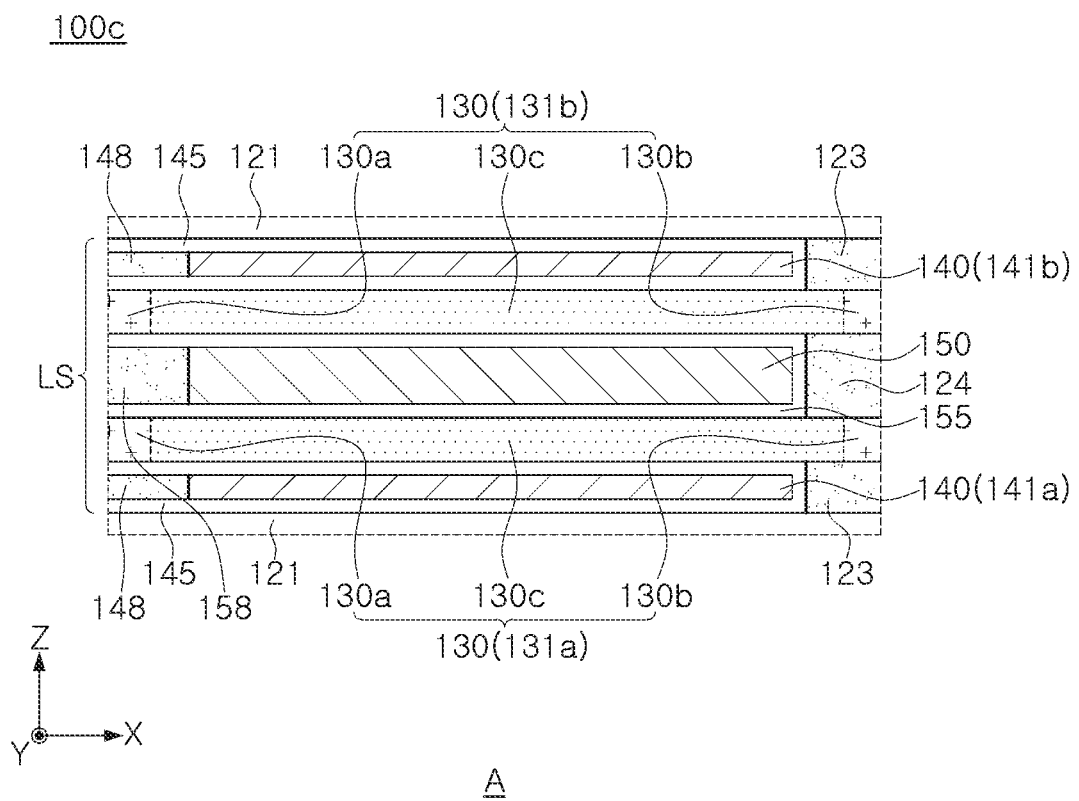

Referring to FIG. 5C, in a semiconductor device 100c, the channel region 130c of the active layer 130 may include portions not overlapping the gate electrodes 140 and the back gate electrode 150 in the Z-direction. For example, a portion of the channel region 130c of the first active layer 131a may extend further in the X-direction, and the first and second regions 130a and 130b may extend to be shorter in the X-direction.

Figure 5D:
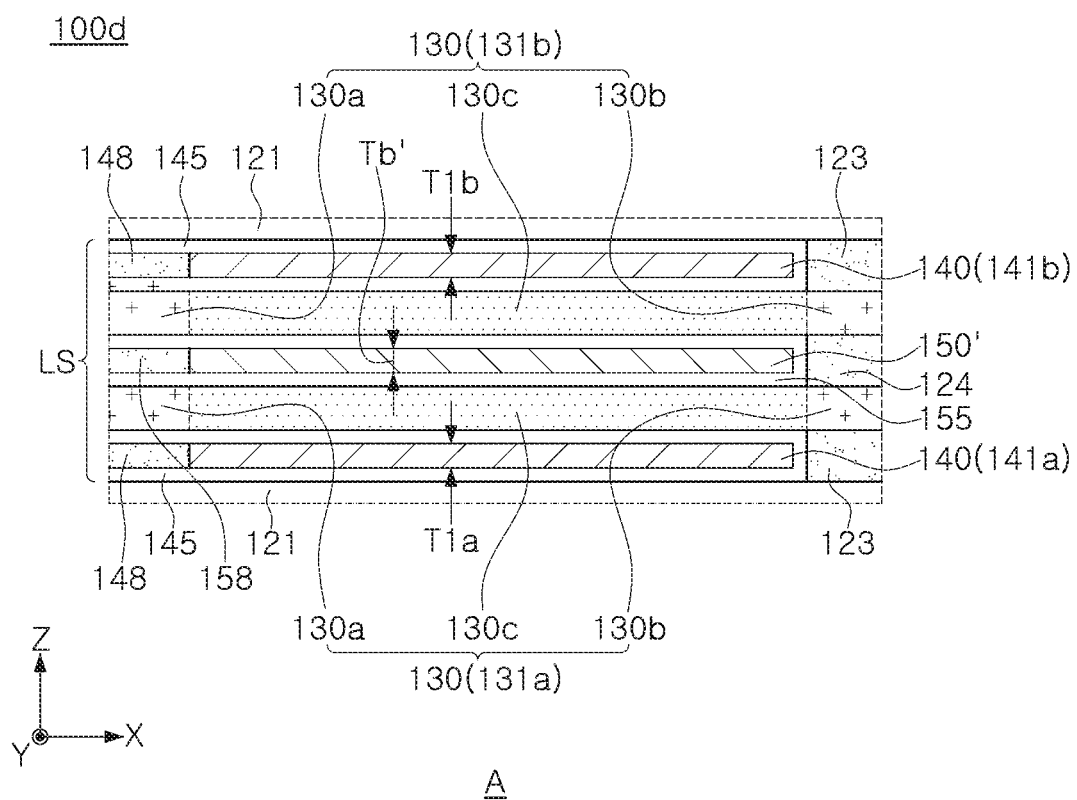

Referring to FIG. 5D, in a semiconductor device 100d, a thickness Tb' of a back gate electrode 150' may be substantially equal to the thickness T1a of the first gate electrode 141a and/or the thickness T1b of the second gate electrode 141b.

In the present disclosure, "substantially the same" means the same or a case where there is a difference in the range of deviations occurring in a manufacturing process, and even when the expression "substantially" is omitted, it may be interpreted to have the same meaning.

Figure 6:
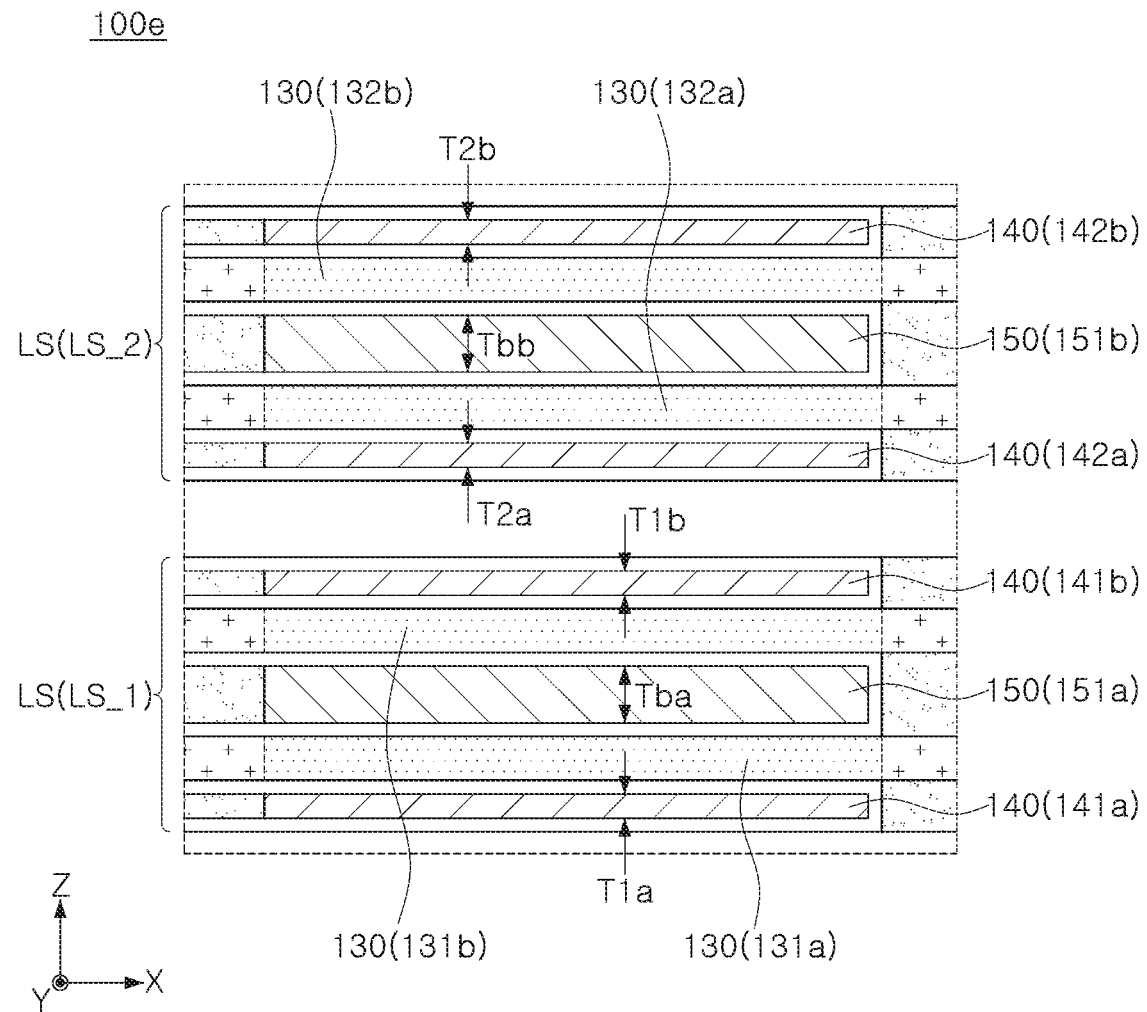
FIG. 6 is a partially enlarged view of a semiconductor device according to example embodiments.

FIG. 6 is a partially enlarged view of a semiconductor device according to example embodiments. FIG. 6 is an enlarged view of a region including two structures LS in the semiconductor device of FIG. 2.

Referring to FIG. 6, in a semiconductor device 100e, a second structure LS_2 may be disposed on a first structure LS_1, the first structure LS_1 may include first and second gate electrodes 141a and 141b, first and second active layers 131a and 131b, and a first back gate electrode 151a, and the second structure LS_2 may include third and fourth gate electrodes 142a and 142b, third and fourth active layers 132a and 132b, and a second back gate electrode 151b. A thickness Tba of the first back gate electrode 151a may be substantially equal to or different from a thickness Tbb of the second back gate electrode 151b. Considering the interlayer characteristic distribution of the memory cell transistors provided in the first structure LS_1 and the memory cell transistors provided in the second structure LS_2, conditions of voltages applied to the first back gate electrode 151a and the second back gate electrode 151b may be set to be different or thickness of the back gate dielectric layers 155 may be formed to be different.

FIGS. 7 to 16 are cross-sectional views illustrating a method of manufacturing a semiconductor device according to example embodiments.

Figure 7:
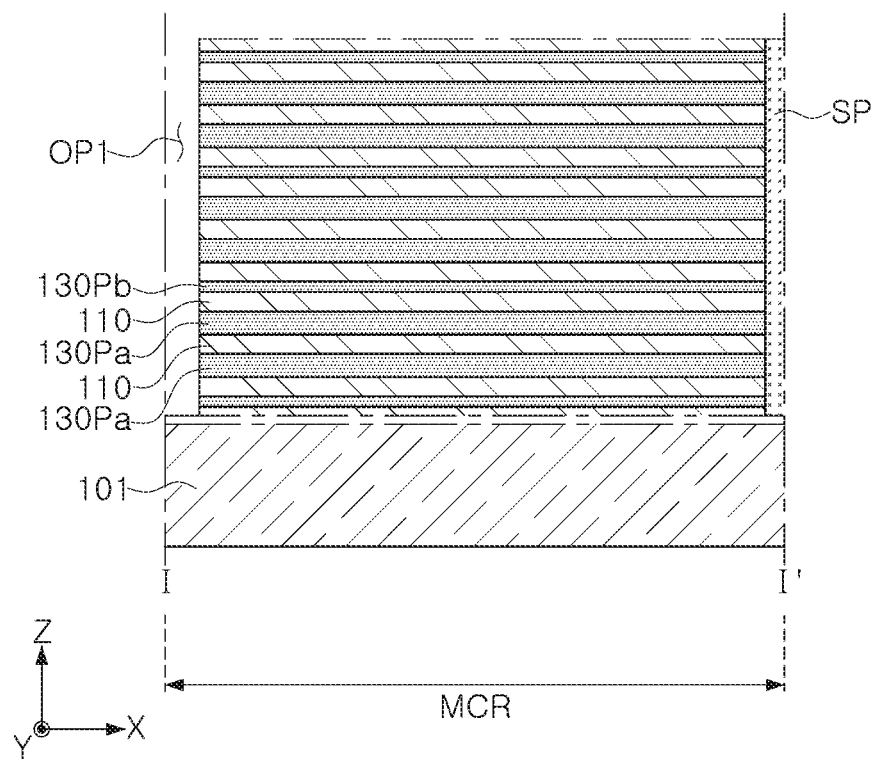
FIGS. 7 to 16 are cross-sectional views illustrating a method of manufacturing a semiconductor device according to example embodiments.

Referring to FIG. 7, a stack structure may be formed by alternately stacking first material layers 110 and second material layers 130Pa and 130Pb on the substrate 101 in the Z-direction, a patterning process may be performed on the substrate 101 to form trenches passing through the first material layers 110 and the second material layers 130Pa and 130Pb and extending in the Y-direction, the trenches may be filled with an insulating material layer, and a sacrificial pattern SP may be formed. Next, a first opening OP1 passing through the first material layers 110 and the second material layers 130Pa and 130Pb may be formed.

The first material layers 110 may be formed of a material different from that of the second material layers 130Pa and 130Pb. For example, the second material layers 130Pa and 130Pb may be formed of silicon, and the first material layers 110 may be formed of silicon-germanium, silicon oxide, silicon nitride, silicon carbide, or silicon oxynitride. The second material layers 130Pa and 130Pb may include a first layer 130Pa and a second layer 130Pb having different thicknesses. The thickness of the second layer 130Pb may be less than the thickness of the first layer 130Pa, and two first layers 130Pa and one second layer 130Pb may be repeatedly stacked, but inventive concepts is not limited thereto.

The patterning process may include forming a separate mask pattern on the stack structure, etching the stack structure using the mask pattern as an etch mask, and removing the mask pattern. The sacrificial pattern SP may be formed of an insulating material layer filling the trenches and the stack structure. The first opening OP1 may be formed in the form of a via or a trench.

Figure 8:
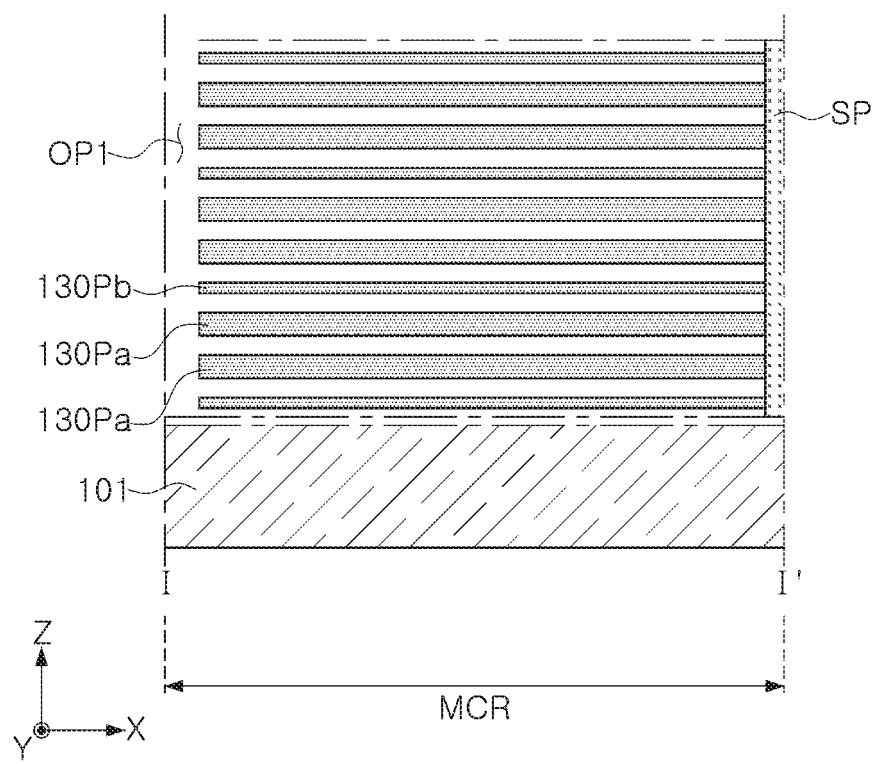

Referring to FIG. 8, the first material layers 110 exposed through the first opening OP1 may be selectively removed with respect to the second material layers 130Pa and 130Pb. While the first material layers 110 are removed, the second material layers 130Pa and 130Pb may be supported by the sacrificial pattern SP and other nearby insulating layers.

Figure 9:
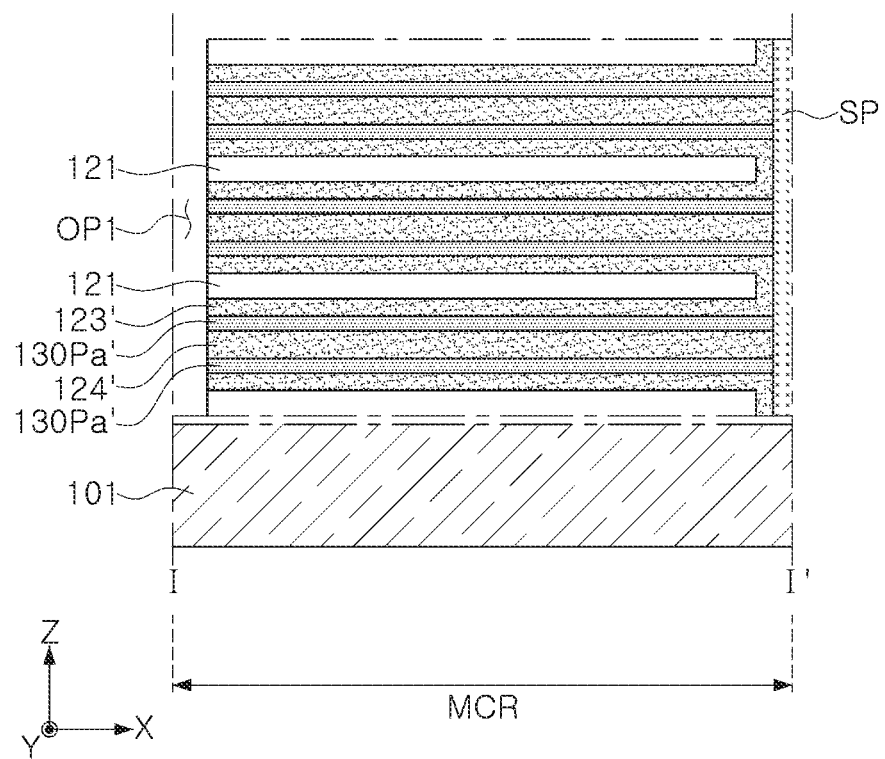

Referring to FIG. 9, an etching process for reducing a thickness of the relatively thick first layer 130Pa may be performed to form a preliminary active layer 130Pa', and preliminary capping layers 123' and 124' and first interlayer insulating layers 121 may be formed between the preliminary active layers 130Pa'. In this process, the relatively thin second layer 130Pb may be removed, and accordingly, the preliminary active layers 130Pa' may be disposed at different intervals in the Z-direction.

A first preliminary capping layer 123' may be conformally formed to have a desired and/or alternatively predetermined thickness in a space between the preliminary active layers 130Pa' at wide intervals in the Z-direction, and an inner space of the first preliminary capping layer 123' may be filled with the first interlayer insulating layer 121. The first interlayer insulating layer 121 may be spaced apart from the sacrificial pattern SP. A space between the preliminary active layers 130Pa' at narrow intervals in the Z-direction may be filled with a second preliminary capping layer 124'.

Referring to FIGS. 1 and 3B together, on the connection regions IR1 and IR2 other than the memory cell region MCR, an etching process for providing pad regions having a step structure of the gate structures 140 and 150 may be performed several times on the multilayer structure, but is not limited thereto.

Figure 10:
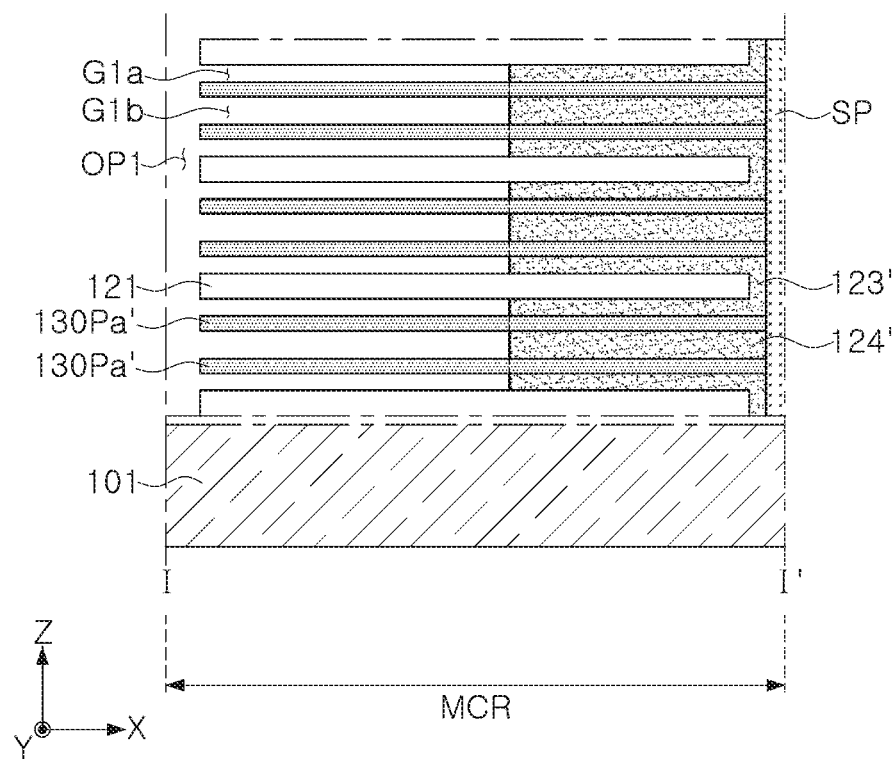

Referring to FIG. 10, first gap regions G1a and G1b may be formed by partially removing the preliminary capping layers 123' and 124' from the first opening OP1. The preliminary capping layers 123' and 124' may be selectively removed with respect to the preliminary active layers 130' and the first interlayer insulating layers 121. The gap regions G1b between the preliminary active layers 130Pa', among the first gap regions G1a and G1b, may have a relatively wide space, but is not limited thereto.

Figure 11:
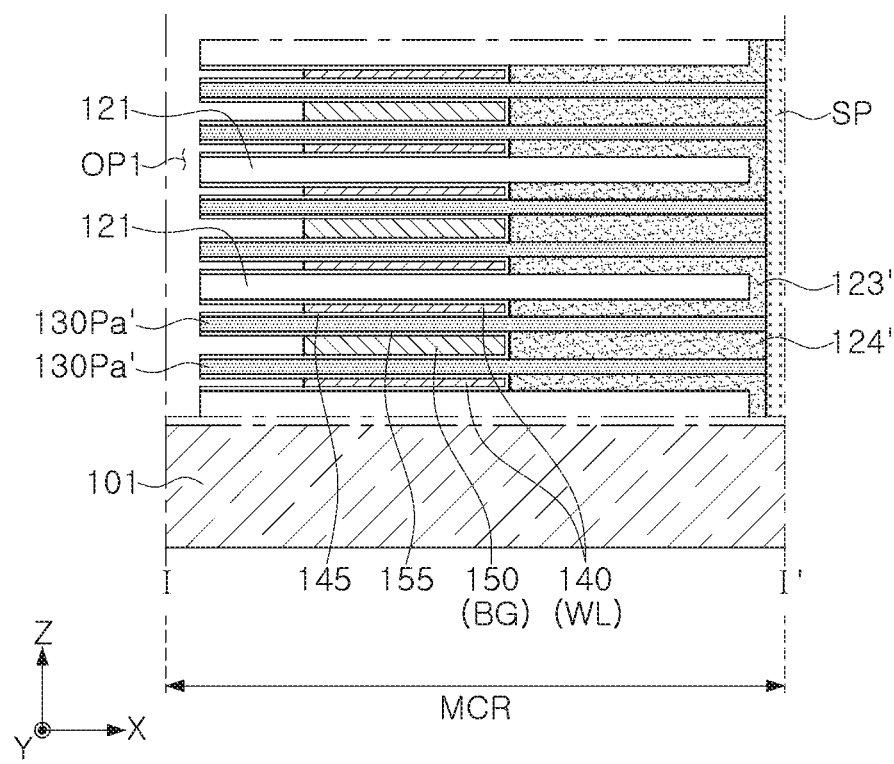

Referring to FIG. 11, the gate dielectrics 145 and 155 and the gate structures 140 and 150 may be formed in the first gap regions G1a and G1b.

The gate dielectrics 145 and 155 may be conformally formed in the first gap regions G1a and G1b, the inner space of the first gap regions G1a and G1b may be filled with a conductive material, and then the conductive material may be partially removed from a side surface exposed from the first opening OP1 to form the gate structures 140 and 150.

Figure 12:
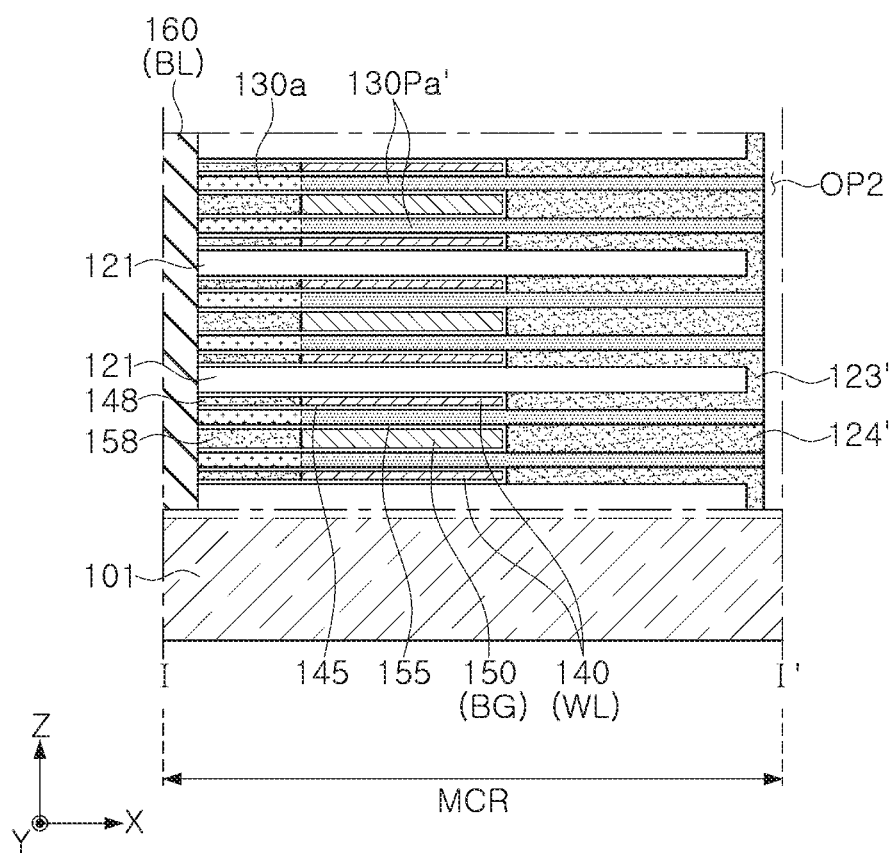

Referring to FIG. 12, the second capping layers 148 and 158 may be formed, an ion doping process may be performed on a partial region of the preliminary active layers 130Pa' exposed through the first opening OP1 to form the first regions 130a, the vertical conductive patterns 160 may be formed, and the sacrificial pattern SP may be removed to form a second opening OP2.

The second capping layers 148 and 158 may be formed in a region from which the conductive material is partially removed, in the inner space of the first gap regions G1a and G1b. Impurities may be implanted from the end portions of the preliminary active layers 130Pa' by the ion doping process, and the implanted impurities may be diffused by a heat treatment process. For example, the ion doping process may be a lateral ion implantation process. A conductive material may be deposited in the first opening OP1 to form the vertical conductive patterns 160. The second opening OP2 may have a trench shape extending in the Y-direction, and side surfaces of the preliminary active layers 130Pa' and the preliminary capping layers 123' and 124' may be exposed through the second opening OP2.

Figure 13:
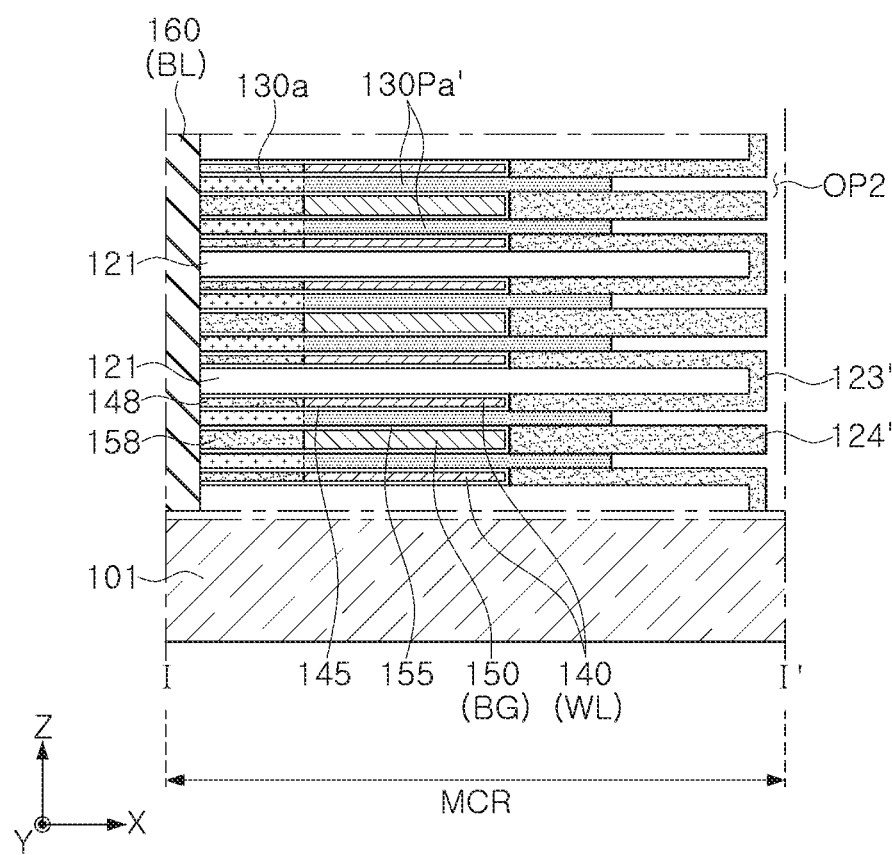

Referring to FIG. 13, a portion of the preliminary active layers 130Pa' exposed through the second opening OP2 may be selectively removed with respect to the preliminary capping layers 123' and 124'.

Figure 14:
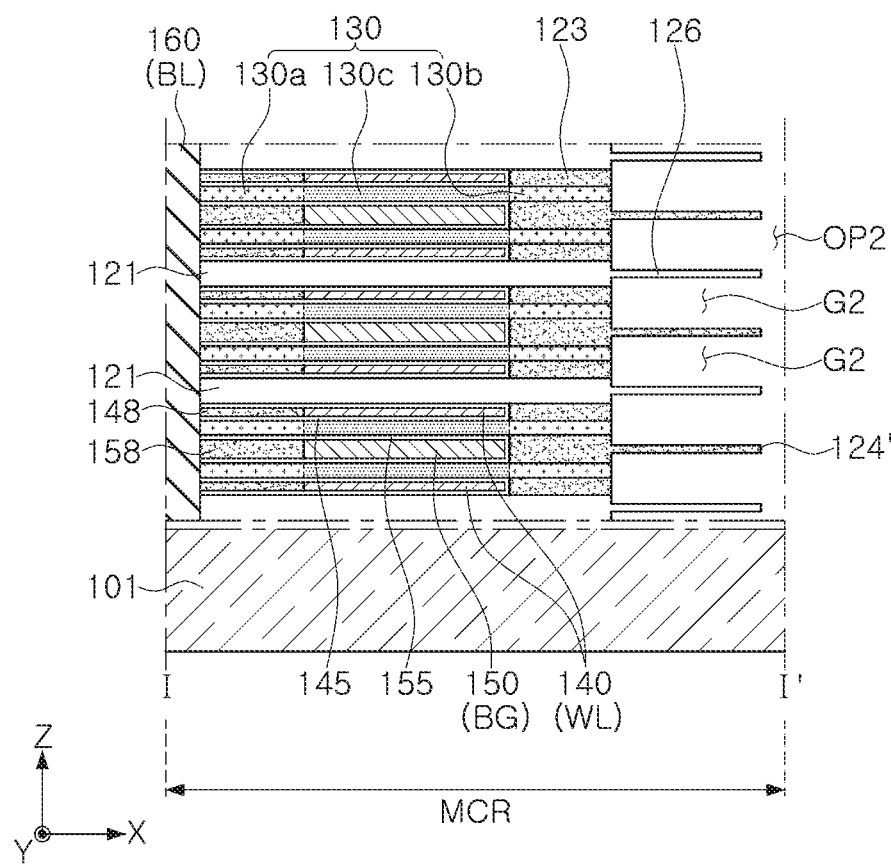

Referring to FIG. 14, an etching process may be performed on the preliminary capping layers 123' and 124' to form second gap regions G2, and the preliminary active layers exposed to the second gap regions G2, and an ion doping process may be performed on a partial region of the preliminary active layers 130Pa' exposed to the second gap regions G2 to form the second regions 130b.

Performing the etching process may include performing a plurality of wet etching processes. For example, by a first wet etching process, the first preliminary capping layer 123' covering the first interlayer insulating layer 121, among the preliminary capping layers 123' and 124' formed of silicon nitride, may be removed and a thickness of the thick second preliminary capping layer 124' may be reduced. Next, by a second wet etching process, a thickness of a partial region of the first interlayer insulating layers 121 formed of silicon oxide may be reduced. Accordingly, the first capping insulating layer 123 and the first separation insulating layer 126 may be formed.

Impurities may be implanted from the end portions of the preliminary active layers 130Pa' by an ion doping process, and the implanted impurities may be diffused by a heat treatment process. For example, the ion doping process may be a lateral ion implantation process. Accordingly, the active layer 130 including the first region 130a, the second region 130b, and the channel region 130c may be formed.

Figure 15:
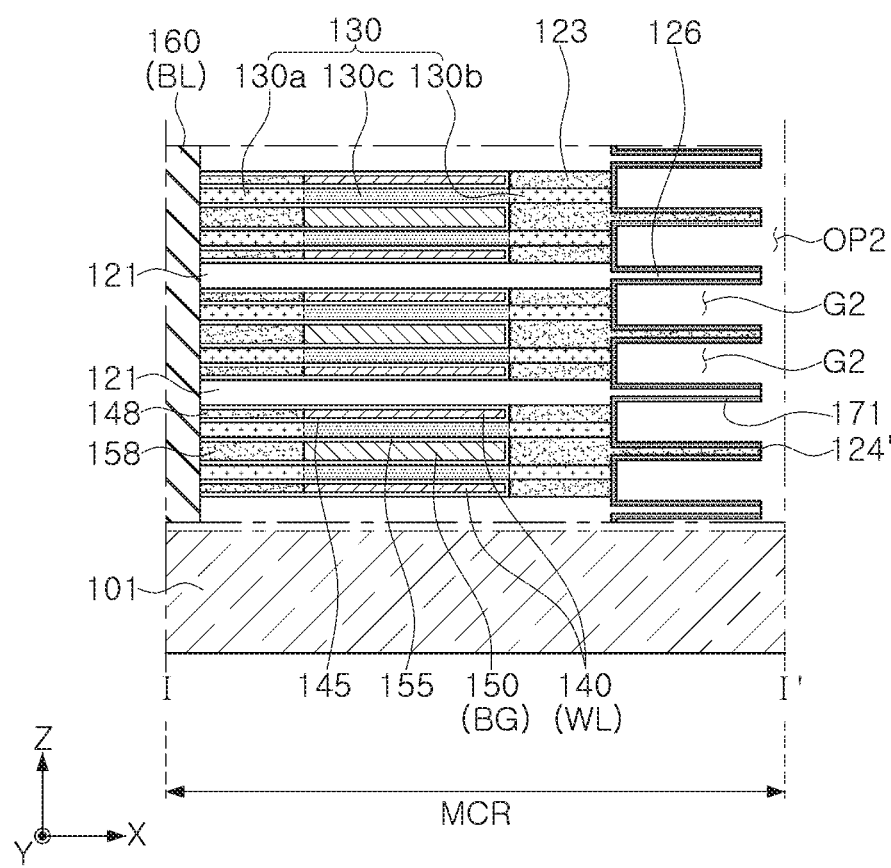

Referring to FIG. 15, first electrodes 171 may be formed in the second gap regions G2.

After the conductive material is conformally formed in the second gap regions G2, a portion of the conductive material covering the end portions of the first separation insulating layers 126 and the end portions of the second preliminary capping layers 124' may be removed to form node-separated first electrodes 171.

Figure 16:
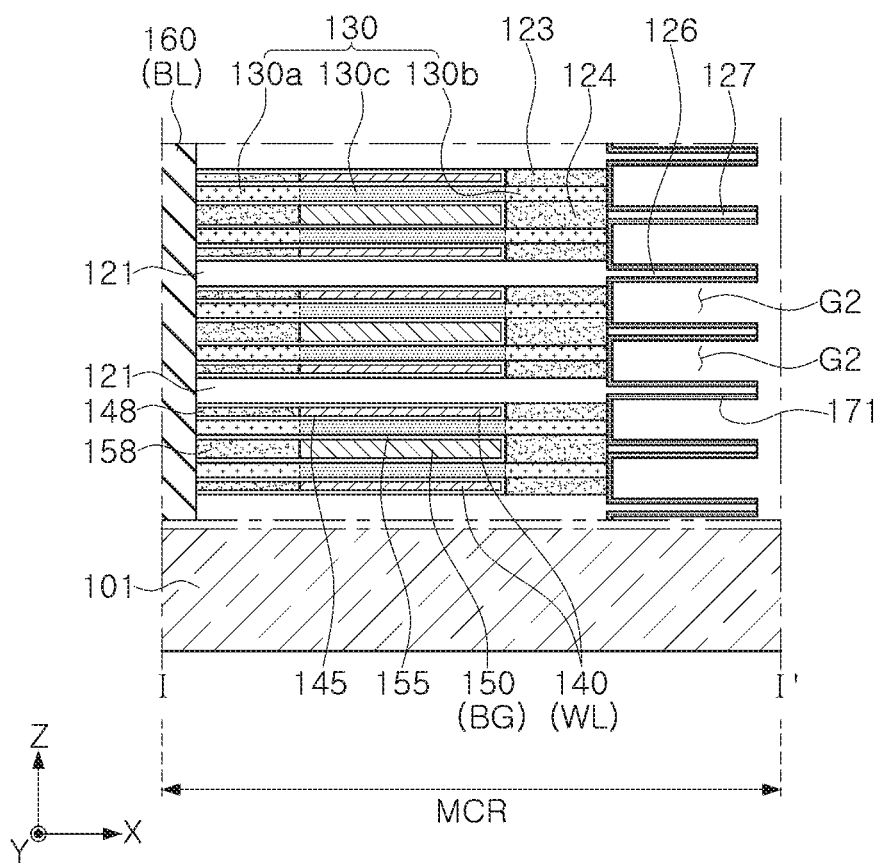

Referring to FIG. 16, after the second preliminary capping layers 124' are selectively removed, second separation insulating layers 127 may be formed.

Thereafter, referring to FIGS. 3A and 3B, by conformally forming the capacitor dielectric 175 on the first electrodes 171 and forming the second electrode 172 on the capacitor dielectric 175, the capacitor structure CAP may be formed. Next, the contact plugs 180 connected to the gate structures 140 and 150 may be formed to manufacture the semiconductor device 100.

By disposing the back gate electrode between the gate electrodes, the semiconductor device having improved electrical characteristics and improved integration may be provided.

While example embodiments have been shown and described above, it will be apparent to those skilled in the art that modifications and variations could be made without departing from the scope of inventive concepts as defined by the appended claims.

What is claimed is:

1. A semiconductor device comprising:
   a substrate including a first connection region, a second connection region, and a memory cell region between the first connection region and the second connection region;
   gate electrodes stacked on the substrate, the gate electrodes spaced apart from each other and extending in a first direction, the first direction parallel to an upper surface of the substrate, the gate electrodes including first pad regions having a first step structure on the first connection region;
   back gate electrodes between the gate electrodes, the back gate electrodes extending in a direction opposite the first direction, the back gate electrodes including second pad regions having a second step structure on the second connection region;
   vertical conductive patterns extending in a vertical direction, the vertical direction perpendicular to the upper surface of the substrate, and the vertical conductive patterns being spaced apart from each other in the first direction on the memory cell region of the substrate;
   active layers between the gate electrodes and the back gate electrodes on the memory cell region of the substrate, the active layers extending in a second direction, the second direction intersecting the first direction and parallel to the upper surface of the substrate, and the active layers being electrically connected to the vertical conductive patterns; and
   a data storage structure electrically connected to the active layers.

2. The semiconductor device of claim 1, wherein
   the gate electrodes include a first gate electrode and a second gate electrode spaced apart from each other in the vertical direction,
   the back gate electrodes include a first back gate electrode between the first gate electrode and the second gate electrode, and
   the active layers include a first active layer between the first gate electrode and the first back gate electrode and a second active layer between the second gate electrode and the first back gate electrode.

3. The semiconductor device of claim 2, further comprising:
   a first contact plug connected to the first gate electrode on the first connection region;
   a second contact plug connected to the second gate electrode on the first connection region; and
   a third contact plug connected to the first back gate electrode on the second connection region.

4. The semiconductor device of claim 2, wherein an end surface of the second gate electrode and a first end surface of the first back gate electrode are coplanar on the first connection region.

5. The semiconductor device of claim 4, wherein an end surface of the first gate electrode and a second end surface of the first back gate electrode are coplanar on the second connection region.

6. The semiconductor device of claim 2, wherein a vertical thickness of the first back gate electrode is different from a vertical thickness of the first gate electrode.

7. The semiconductor device of claim 2, further comprising:
   gate dielectric layers covering upper surfaces and lower surfaces of each of the gate electrodes; and
   back gate dielectric layers covering upper surfaces and lower surfaces of each of the back gate electrodes, wherein
   the gate dielectric layers include a first gate dielectric layer between the first gate electrode and the first active layer and a second gate dielectric layer between the second gate electrode and the second active layer, and
   the back gate dielectric layers include a first back gate dielectric layer between the first back gate electrode and the first active layer and between the first back gate electrode and the second active layer.

8. The semiconductor device of claim 7, wherein a vertical thickness of the first back gate dielectric layer is different from a vertical thickness of the first gate dielectric layer.

9. The semiconductor device of claim 1, wherein
   each of the active layers includes a channel region between a first source/drain region and a second source/drain region, and
   the gate electrodes and the back gate electrodes overlap the channel region on the memory cell region of the substrate.

10. The semiconductor device of claim 9, wherein
    the data storage structure includes a first electrode, a second electrode, and a capacitor dielectric between the first electrode and the second electrode,
    the first source/drain region is electrically connected to the vertical conductive patterns, and
    the second source/drain region is electrically connected to the first electrode.

11. The semiconductor device of claim 1, further comprising:
    first interlayer insulating layers; and
    second interlayer insulating layers contacting side surfaces of the active layers, wherein
    the semiconductor device includes a plurality of gate structures stacked on the substrate and spaced apart from each other,
    each of the plurality of gate structures includes a corresponding one of the back gate electrodes between a corresponding two of the gate electrodes, and
    the first interlayer insulating layers are between the plurality of gate structures, and
    each pair of the second interlayer insulating layers are in a corresponding one of the plurality of gate structures between the corresponding two of the gate electrodes and the corresponding one of the back gate electrodes.

12. The semiconductor device of claim 1, further comprising:
  gate capping layers between the gate electrodes and the vertical conductive patterns; and
  back gate capping layers between the back gate electrodes and the vertical conductive patterns.

13. A semiconductor device comprising:
  a substrate;
  a plurality of structures and a plurality of first interlayer insulating layers alternately stacked on the substrate;
  a vertical conductive pattern on the substrate, the vertical conductive pattern extending in a first direction, the first direction perpendicular to an upper surface of the substrate; and
  a data storage structure on the substrate, the data storage structure contacting the plurality of structures and the plurality of first interlayer insulating layers, wherein
  each of the plurality of structures includes a first gate electrode, a back gate electrode on the first gate electrode, a second gate electrode on the back gate electrode, a first active layer between the first gate electrode and the back gate electrode, and a second active layer between the second gate electrode and the back gate electrode,
  the first active layer and the second active layer extend in a second direction,
  the second direction is parallel to the upper surface of the substrate,
  the first active layer and the second active layer are electrically connected to the vertical conductive pattern, and
  the first active layer and the second active layer respectively include a region overlapping the back gate electrode in the first direction,
  wherein a first distance in the first direction from an upper surface of the first gate electrode to a lower surface of the back gate electrode is substantially the same as a second distance in the first direction from a lower surface of the second gate electrode to an upper surface of the back gate electrode.

14. The semiconductor device of claim 13, wherein
  the first gate electrode extends in a third direction and includes a first pad region,
  the third direction intersects the second direction,
  the second gate electrode extends in the third direction less than the first gate electrode in the third direction,
  the second gate electrode includes a second pad region,
  the back gate electrode extends in a direction opposite the third direction,
  the back gate electrode extends longer than the second gate electrode, and
  the back gate electrode includes a third pad region.

15. The semiconductor device of claim 14, further comprising:
  a first contact plug connected to the first pad region;
  a second contact plug connected to the second pad region; and
  a third contact plug connected to the third pad region.

16. The semiconductor device of claim 15, wherein
  the first contact plug is adjacent to a first end surface of the back gate electrode,
  the third contact plug is adjacent to a second end surface of the back gate electrode, and
  the second end surface of the back gate electrode is opposite the first end surface of the back gate electrode.

17. The semiconductor device of claim 13, wherein the data storage structure includes:
  a plate electrode on the substrate;
  a first storage node electrode electrically connected to the first active layer;
  a second storage node electrode electrically connected to the second active layer; and
  a capacitor dielectric, the capacitor dielectric between the plate electrode and the first storage node electrode, and the capacitor dielectric between the plate electrode and the second storage node electrode.

18. A semiconductor device comprising:
  a substrate including a first connection region, a second connection region, and a memory cell region between the first connection region and the second connection region;
  a first active layer and a second active layer on the memory cell region of the substrate, the first active layer and the second active layer extending in a first direction, the first direction parallel to an upper surface of the substrate;
  a gate structure intersecting the first active layer and the second active layer, the gate structure extending in a second direction, the second direction parallel to the upper surface of the substrate; and
  a vertical conductive pattern connected to the first active layer and the second active layer, the vertical conductive pattern extending in a third direction, the third direction perpendicular to the upper surface of the substrate,
  wherein the gate structure includes a back gate electrode between the first active layer and the second active layer, a first gate electrode below the first active layer, and a second gate electrode on the second active layer,
  the back gate electrode and the second gate electrode each extend less than the first gate electrode on the first connection region, and
  the second gate electrode extends less than the back gate electrode on the second connection region.

19. The semiconductor device of claim 18, further comprising:
  contact plugs connected to the gate structure, wherein
  the contact plugs include a first contact plug connected to the first gate electrode on the first connection region, a second contact plug connected to the second gate electrode on the first connection region, and a third contact plug connected to the back gate electrode on the second connection region.

20. The semiconductor device of claim 19, wherein
  a first end surface of the second gate electrode faces the first contact plug, and a
  second end surface of the second gate electrode opposite to the first end surface faces the third contact plug.

* * * * *